US012747078B2

(12) United States Patent
Liao et al.

(10) Patent No.: US 12,747,078 B2

(45) Date of Patent: Sep. 29, 2026

(54) FOOD PACKAGING BARRIER FILM

(71) Applicant: NAN YA PLASTICS CORPORATION, Taipei (TW)

(72) Inventors: Te-Chao Liao, Taipei (TW); Chun-Che Tsao, Taipei (TW); Cheng-Hung Chen, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 58 days.

(21) Appl. No.: 18/931,007

(22) Filed: Oct. 29, 2024

(65) Prior Publication Data

US 2025/0051073 A1 Feb. 13, 2025

Related U.S. Application Data

(62) Division of application No. 17/871,977, filed on Jul. 24, 2022, now Pat. No. 12,172,812.

(30) Foreign Application Priority Data

Oct. 1, 2021 (TW) ................................ 110136637

(51) Int. Cl.

*B65D 65/42* (2006.01)
*C08J 7/048* (2020.01)

(Continued)

(52) U.S. Cl.

CPC .............. *B65D 65/42* (2013.01); *C08J 7/048* (2020.01); *C23C 14/081* (2013.01); *C23C 14/10* (2013.01);

(Continued)

(58) Field of Classification Search

CPC .... B65D 65/42; B65D 2565/387; C08J 7/048; C23C 14/081; C23C 14/30; C23C 14/10; C23C 14/26; B32B 9/00; B32B 27/06

See application file for complete search history.

(56) References Cited

U.S. PATENT DOCUMENTS 5,112,673 A * 5/1992 Sawada ................ B32B 27/306 428/424.4

6,656,602 B1 * 12/2003 Ishikawa ............... C08K 5/057 524/394

(Continued)

*Primary Examiner* — Andrew M Tecco

*Assistant Examiner* — Nicholas E Igbokwe

(74) *Attorney, Agent, or Firm* — Li & Cai Intellectual Property Office

(57) ABSTRACT

A food packaging barrier film is provided. The food packaging barrier film includes a base film, an inorganic laminated film formed on a surface of the base film, and a barrier coating layer formed on the inorganic laminated film. The inorganic laminated film includes at least one first inorganic material deposition layer and a second inorganic material deposition layer stacked upon each other, and the at least one first inorganic material deposition layer and the second inorganic material deposition layer are formed in a same vacuum deposition process and in a vacuum condition. The at least one first inorganic material deposition layer and the second inorganic material deposition layer are respectively formed by different inorganic metal oxides in the same vacuum deposition process. The barrier coating layer is formed by coating a barrier coating solution on the inorganic laminated film and then curing the barrier coating solution.

6 Claims, 3 Drawing Sheets

100

(51) Int. Cl.
*C23C 14/08* (2006.01)
*C23C 14/10* (2006.01)
*C23C 14/26* (2006.01)
*C23C 14/30* (2006.01)

(52) U.S. Cl.
CPC .............. *C23C 14/26* (2013.01); *C23C 14/30* (2013.01); *B65D 2565/387* (2013.01)

(56) References Cited

U.S. PATENT DOCUMENTS

| | | | | |
|---|---|---|---|---|
| 2004/0131868 | A1* | 7/2004 | Watanabe | B32B 27/30<br>428/500 |
| 2006/0216548 | A1 | 9/2006 | Mao et al. | |
| 2011/0223434 | A1* | 9/2011 | Roehrig | C23C 14/3464<br>428/688 |
| 2014/0356728 | A1* | 12/2014 | Honda | B32B 37/0053<br>429/246 |
| 2016/0075910 | A1* | 3/2016 | Omori | C08J 7/046<br>428/480 |
| 2018/0170017 | A1* | 6/2018 | Ettridge | B32B 27/08 |

* cited by examiner

FOOD PACKAGING BARRIER FILM

CROSS-REFERENCE TO RELATED PATENT APPLICATION

This application is a divisional application of the U.S. application Ser. No. 17/871,977, filed on Jul. 24, 2022 and entitled "FOOD PACKAGING BARRIER FILM AND METHOD FOR PRODUCING THE SAME", now pending, the entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a barrier film, and more particularly to a food packaging barrier film.

BACKGROUND OF THE DISCLOSURE

In the technical field of a food packaging barrier film, the food packaging barrier film is conventionally made of metal material and/or aluminum foil material to increase a thickness of a deposition layer and the number of layers of a coating layer thereof, so that an oxygen barrier effect of the food packaging barrier film is increased.

However, there are many problems and restrictions in the related art. For instance, most of the metal material and/or aluminum foil material used in the conventional food packaging barrier film are not transparent, so that a surface of the conventional food packaging barrier film does not have a high degree of transparency. Accordingly, the application of the conventional food packaging barrier film is limited.

Furthermore, since a single deposition layer and/or a single coating layer of the conventional food packaging barrier film may excessively increase the high oxygen and water vapor transmission rates, the water and oxygen barrier properties of the conventional food packaging barrier film are not high enough.

More specifically, although increasing the thickness of the single deposition layer and/or increasing the number of coating layers can make the conventional food packaging barrier film achieve high water and oxygen barrier properties, the coating engineering cost and manufacturing cost are also relatively increased.

SUMMARY OF THE DISCLOSURE

In response to the above-referenced technical inadequacies, the present disclosure provides a food packaging barrier film and a method for producing the same.

In one aspect, the present disclosure provides a method for producing a food packaging barrier film, and the method includes providing a base film, depositing an inorganic laminated film on a surface of the base film, and coating a barrier coating solution on the inorganic laminated film and then curing the barrier coating solution to form a barrier coating layer. The inorganic laminated film includes at least one first inorganic material deposition layer and a second inorganic material deposition layer stacked upon each other, and the at least one first inorganic material deposition layer and the second inorganic material deposition layer are formed in a same vacuum deposition process and in a vacuum condition. The at least one first inorganic material deposition layer and the second inorganic material deposition layer are respectively formed by different inorganic metal oxides in the same vacuum deposition process.

In certain embodiments, a material hardness of the at least one first inorganic material deposition layer is greater than a material hardness of the second inorganic material deposition layer. When the food packaging barrier film is bent, the second inorganic material deposition layer is configured to buffer a stress that is provided by the at least one first inorganic material deposition layer.

In certain embodiments, the base film is a polyester film and has a thickness that is within a range from 5 μm to 300 μm, in which the at least one first inorganic material deposition layer has a thickness that is within a range from 1 nm to 100 nm, and the second inorganic material deposition layer has a thickness that is within a range from 1 nm to 100 nm.

In certain embodiments, the inorganic metal oxides is transparent and is at least one material selected from a group consisting of aluminum oxide, silicon oxide, cobalt oxide, silicon nitride, silicon nitride, indium tin oxide, and tantalum pentoxide.

In certain embodiments, the inorganic metal oxides is at least one material selected from a group consisting of aluminum oxide and silicon oxide, and in which the at least one first inorganic material deposition layer is an aluminum oxide deposition layer, and the second inorganic material deposition layer is a silicon oxide deposition layer.

In certain embodiments, the step of depositing the inorganic laminated film on the surface of the base film includes disposing the base film on a tray of a vacuum deposition apparatus and respectively disposing two different inorganic materials on two tungsten carriers of the vacuum deposition apparatus, evacuating a deposition chamber of the vacuum deposition apparatus with a vacuum pump so that a vacuum environment is created, and respectively heating the two different inorganic materials with a first heating source and a second heating source of the vacuum deposition apparatus through rotating and switching such that the at least one first inorganic material deposition layer and the second inorganic material deposition layer are sequentially deposited on the surface of the base film in the same vacuum deposition process and in the vacuum condition, and in which the first heating source is a thermal resistance heating source, and the second heating source is an electron beam heating source.

In certain embodiments, the barrier coating solution contains a resin material, a crosslinking agent, filler particles treated with surface modification treatment agent, an additive, and a water solvent, and in which based on a total weight of the barrier coating solution being 100 wt %, a content of the resin material is within a range from 2 wt % to 20 wt %, a content of the crosslinking agent is within a range from 1 wt % to 10 wt %, a content of the filler particles treated with the surface modification treatment agent is within a range from 0.05 wt % to 40 wt %, a content of the additive is within a range from 0.05 wt % to 10 wt %, and a content of the water solvent is within a range from 25 wt % to 85 wt %.

In certain embodiments, the resin material is at least one material selected from a group consisting of polyetheramine, ethylene-ethyl acrylate, ethylene-vinyl alcohol copolymer, and polyvinyl alcohol. The crosslinking agent is at least one material selected from a group consisting of maleic acid, tartaric acid, tri-mesoly chloride, succinic acid, suberic acid, malic acid, glyoxal, glutaraldehyde, and toluene dialdehyde. The surface modification treatment agent is at least one material selected from a group consisting of vinyl silane coupling agent, epoxy silane coupling agent, styryl silane coupling agent, methacryloyloxysilane coupling agent, acryloyloxysilane coupling agent, aminosilane coupling agent, isocyanurate silane coupling agent, ureasilane coupling agent, and isocyanate silane coupling agent. The filler particles are at least one material selected from a group consisting of graphene, carbon nanotube, clay, talcum powder, mica powder, kaolinite, montmorillonite, silicon oxide, aluminum oxide, and calcium carbonate. The additive is at least one material selected from a group consisting of a leveling agent, a wetting agent, a de-foamer, a UV absorber, a preservative, and an antistatic agent.

In another aspect, the present disclosure provides a food packaging barrier film, and the food packaging barrier film includes a base film, an inorganic laminated film, and a barrier coating layer. The inorganic laminated film is formed on a surface of the base film, the inorganic laminated film includes at least one first inorganic material deposition layer and a second inorganic material deposition layer stacked upon each other, and the at least one first inorganic material deposition layer and the second inorganic material deposition layer are formed in a same vacuum deposition process and in a vacuum condition. The at least one first inorganic material deposition layer and the second inorganic material deposition layer are respectively formed by different inorganic metal oxides in the same vacuum deposition process. The barrier coating layer is formed on the inorganic laminated film, and the barrier coating layer is formed by coating a barrier coating solution on the inorganic laminated film and then curing the barrier coating solution.

In certain embodiments, a material hardness of the at least one first inorganic material deposition layer is greater than a material hardness of the second inorganic material deposition layer. When the food packaging barrier film is bent, the second inorganic material deposition layer is configured to buffer a stress that is provided by the at least one first inorganic material deposition layer.

In certain embodiments, the food packaging barrier film has an oxygen transmission rate that is no more than 1 $cc/m^2 \cdot day \cdot atm$, a water vapor transmission rate that is no more than 1 $g/m^2 \cdot day \cdot atm$, a visible light transmittance that is not less than 90%, and a haze value that is no more than 3%.

In certain embodiments, the base film is a polyester film and has a thickness that is within a range from 5 μm to 300 μm, in which the at least one first inorganic material deposition layer has a thickness that is within a range from 1 nm to 100 nm, and the second inorganic material deposition layer has a thickness that is within a range from 1 nm to 100 nm.

In certain embodiments, the inorganic metal oxides is at least one material selected from a group consisting of aluminum oxide and silicon oxide. The at least one first inorganic material deposition layer is aluminum oxide deposition layer, and the second inorganic material deposition layer is silicon oxide deposition layer.

In certain embodiments, the barrier coating solution contains a resin material, a crosslinking agent, filler particles treated with surface modification treatment agent, an additive, and a water solvent, and in which based on a total weight of the barrier coating solution being 100 wt %, a content of the resin material is within a range from 2 wt % to 20 wt %, a content of the crosslinking agent is within a range from 1 wt % to 10 wt %, a content of the filler particles treated with the surface modification treatment agent is within a range from 0.05 wt % to 40 wt %, a content of the additive is within a range from 0.05 wt % to 10 wt %, and a content of the water solvent is within a range from 25 wt % to 85 wt %.

In yet another aspect, the present disclosure provides a food packaging barrier film, and the food packaging barrier film includes a base film, an inorganic laminated film, and a barrier coating layer. The inorganic laminated film is formed on a surface of the base film. The inorganic laminated film includes at least one first inorganic material deposition layer and a second inorganic material deposition layer stacked upon each other, and the at least one first inorganic material deposition layer and the second inorganic material deposition layer are respectively formed by different inorganic metal oxides. A material hardness of the at least one first inorganic material deposition layer is greater than a material hardness of the second inorganic material deposition layer. The barrier coating layer is formed on the inorganic laminated film, and the barrier coating layer is formed by coating a barrier coating solution on the inorganic laminated film and then curing the barrier coating solution. When the food packaging barrier film is bent, the second inorganic material deposition layer is configured to buffer a stress that is provided by the at least one first inorganic material deposition layer.

Therefore, the method for producing the food packaging barrier film provided by the present embodiment of the disclosure has a lower material cost and a lower coating engineering cost. The food packaging barrier film provided by the present embodiment of the disclosure has a high transparency, a low haze, and excellent water and oxygen barrier properties, so that the applicability of the food packaging barrier film can be increased. For instance, consumers will be able to clearly see the content of the packaged goods through the food packaging barrier film.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
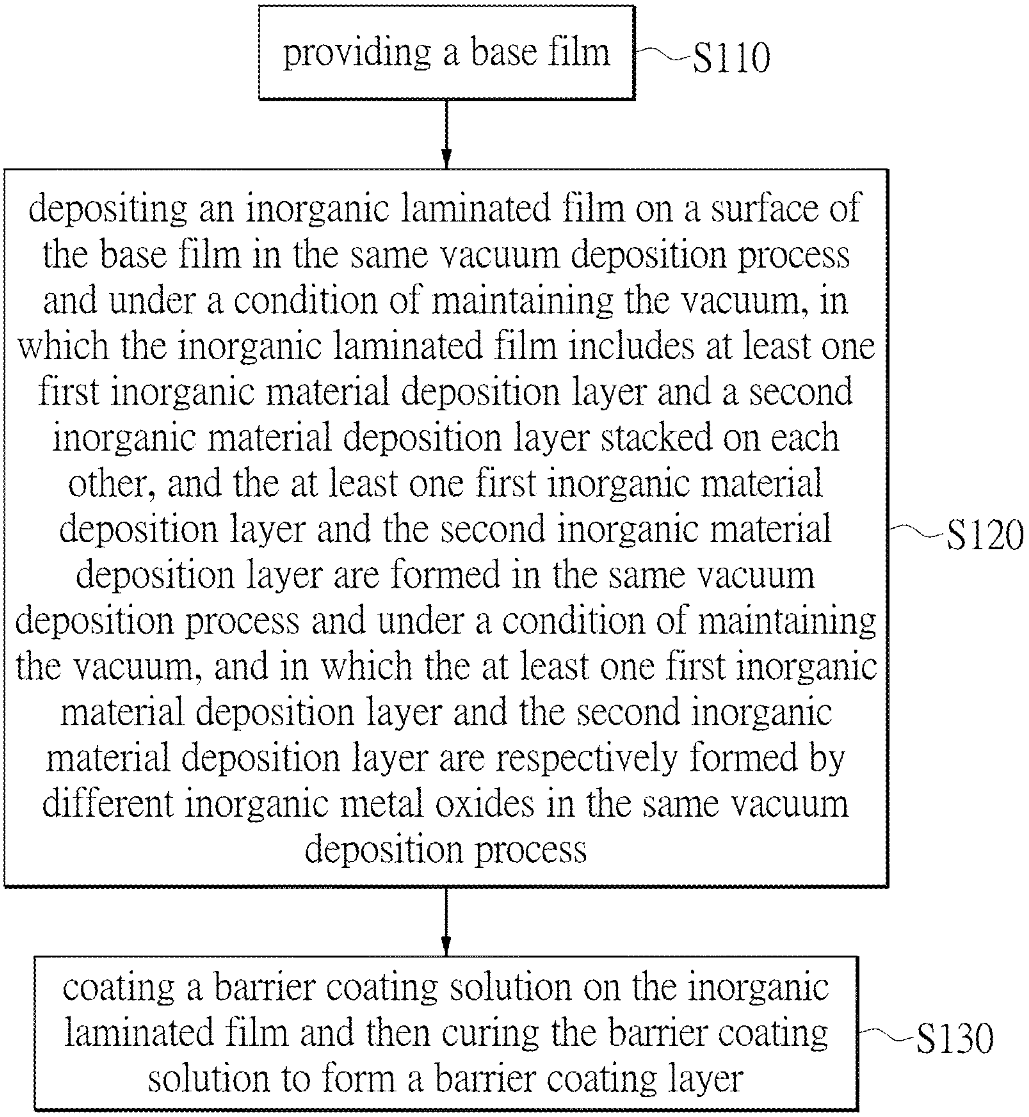
FIG. 1 is a flowchart of a method for producing a food packaging barrier film according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

[Method for Producing a Food Packaging Barrier Film]

Referring to FIG. 1, and FIG. 2A to FIG. 2C, an embodiment of the present disclosure provides a method for producing a food packaging barrier film. The method includes step S110, step S120, and step S130.

Figure 2A:
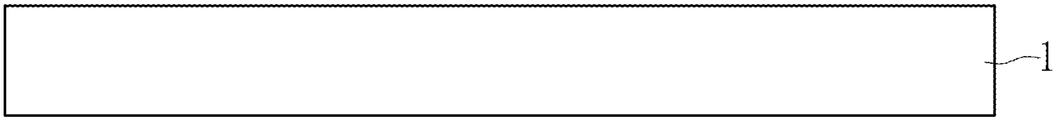
FIG. 2A to FIG. 2C are respectively schematic views of step S110 to step S130 of the method according to the embodiment of the present disclosure.
Figure 2B:
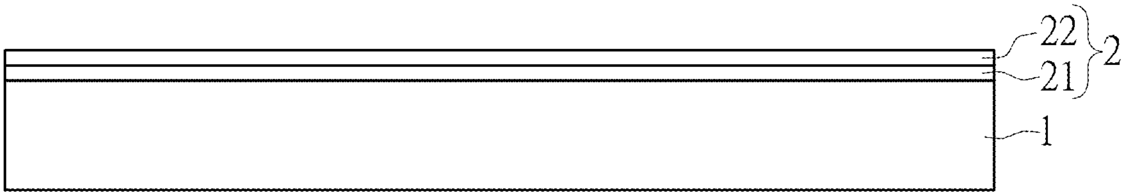
Figure 2C:
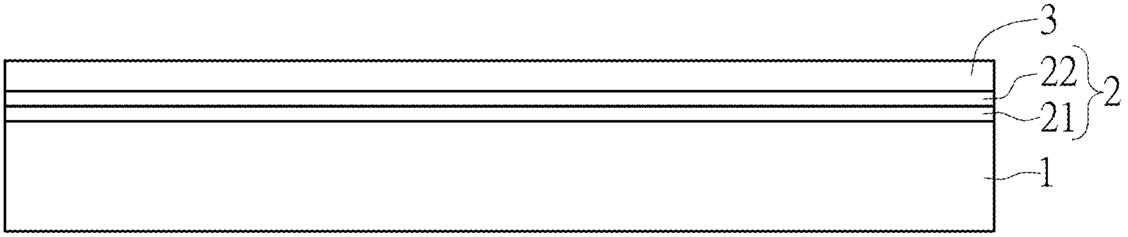

FIG. 1 is a flowchart of the method according to the embodiment of the present disclosure, and FIG. 2A to FIG. 2C are respectively schematic views of step S110 to step S130 of the method according to the embodiment of the present disclosure.

It should be noted that an order of each of the steps and an actual operation manner of the present embodiment can be adjusted according to practical requirements, and are not limited to the present embodiment.

As shown in FIG. 1 and FIG. 2A, the step S110 includes providing a base film, and in the present embodiment, the base film 1 has a thickness that is within a range from 5 μm to 300 μm. In addition, a material composition of the base film 1 contains polyester resin (e.g., PET resin), and the polyester resin of the base film 1 has a content that is within a range from 50 wt % to 95 wt %. That is, the base film 1 is a polyester film.

The material composition of the base film 1 further contains inorganic filler particles, and the inorganic filler particles have a particle size that is within a range from 0.1 μm to 10 μm. The material type of the inorganic filler particles can be, for example, silicon oxide, calcium phosphate, or kaolin. In addition, a content of the inorganic filler particles of the base film 1 is within a range from 5 wt % to 50 wt %.

The base film 1 can have an anti-adhesion function by adding the inorganic filler particles so that the processability of the base film 1 is increased. Furthermore, the base film 1 has a visible light transmittance that is not less than 90% so that the base film 1 is suitable for producing the food packaging barrier film that is transparent.

As shown in FIG. 1 and FIG. 2B, the step S120 includes depositing an inorganic laminated film 2 on a surface of the base film 1 in the same vacuum deposition process and in a vacuum condition. In addition, the inorganic laminated film 2 includes at least one first inorganic material deposition layer 21 and a second inorganic material deposition layer 22 stacked upon each other.

That is, the at least one first inorganic material deposition layer 21 is formed on the surface of the base film 1, and the second inorganic material deposition layer 22 is formed on a surface of the at least one first inorganic material deposition layer 21.

From another point of view, the at least one first inorganic material deposition layer 21 and the second inorganic material deposition layer 22 are formed in the same vacuum deposition process and in the vacuum condition. Furthermore, the at least one first inorganic material deposition layer 21 and the second inorganic material deposition layer 22 are respectively formed by different inorganic metal oxides in the same vacuum deposition process.

The at least one first inorganic material deposition layer 21 has a thickness that is within a range from 1 nm to 100 nm, preferably within a range from 10 nm to 100 nm, and particularly preferably within a range from 10 nm to 50 nm, but the present disclosure is not limited thereto. Similarly, the second inorganic material deposition layer 22 has a thickness that is within a range from 1 nm to 100 nm, preferably within a range from 10 nm to 100 nm, and particularly preferably within a range from 10 nm to 50 nm, but the present disclosure is not limited thereto.

In some embodiments of the present disclosure, the inorganic metal oxides is transparent and is at least one material selected from a group consisting of aluminum oxide (AlOx), silicon oxide (SiOx), cobalt oxide (CoOx), silicon nitride (SiNx), silicon nitride (ZrO2), indium tin oxide (ITO), and tantalum pentoxide (Ta2O5), where x is between 1 and 2, and the inorganic metal oxides is at least one material selected from a group consisting of aluminum oxide and silicon oxide.

For instance, the at least one first inorganic material deposition layer 21 is aluminum oxide deposition layer, and the second inorganic material deposition layer 22 is silicon oxide deposition layer, but the present disclosure is not limited thereto. In other embodiment of the present disclosure, the at least one first inorganic material deposition layer 21 can also be the silicon oxide deposition layer, and the second inorganic material deposition layer 22 can also be the aluminum oxide deposition layer.

In other embodiments not shown in the present disclosure, the inorganic laminated film can, for example, include sequentially stacked a first inorganic material deposition layer (e.g., aluminum oxide deposition layer), a second inorganic material deposition layer (e.g., silicon oxide deposition layer), and a third inorganic material deposition layer (e.g., aluminum oxide deposition layer).

That is, the inorganic laminated film can be a laminated structure that has three of the inorganic material deposition layer, and any two of the inorganic material deposition layer adjacent to each other are respectively formed by different inorganic metal oxides in the same vacuum deposition process.

Figure 3:
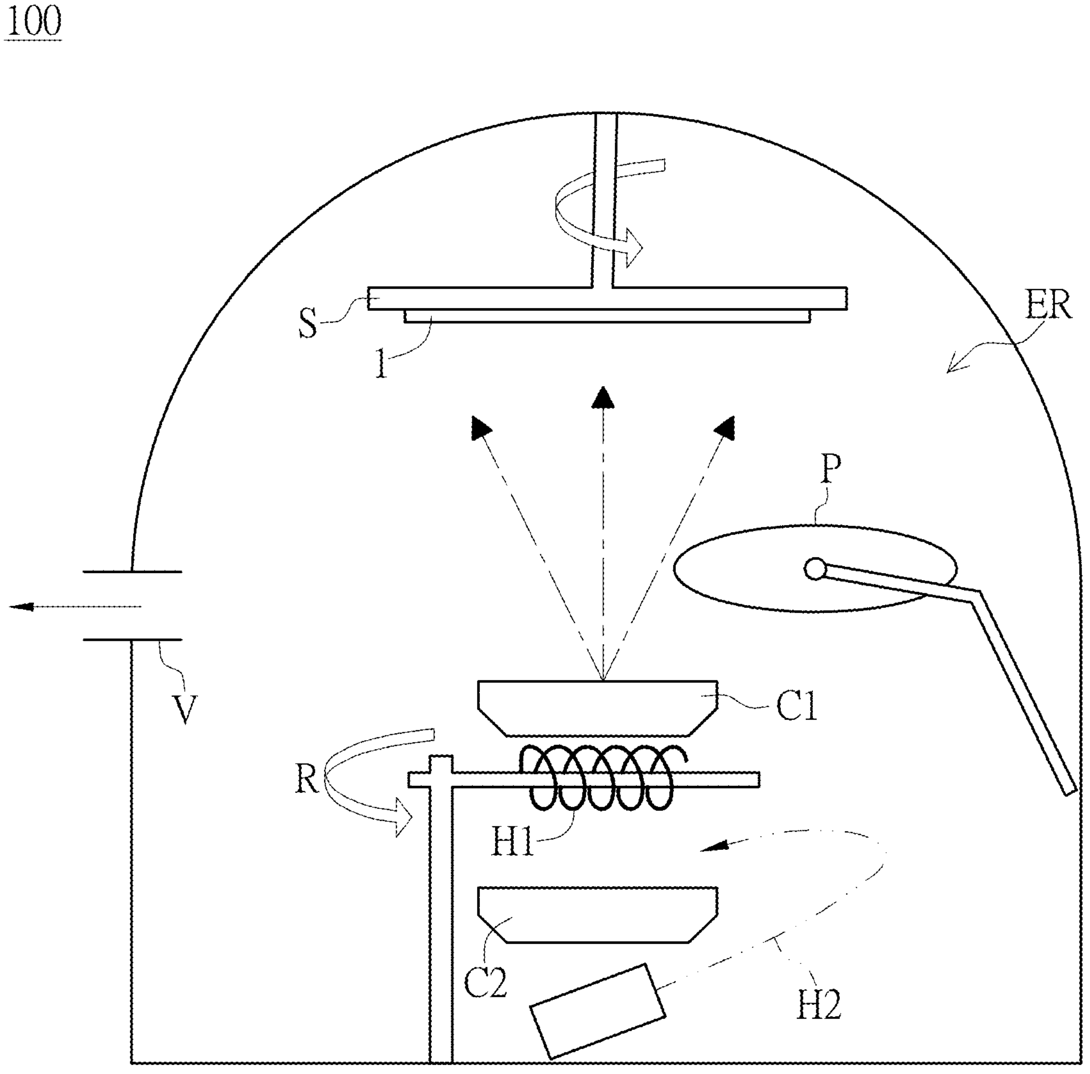
FIG. 3 is a schematic view of inner structures of a vacuum deposition apparatus according to the embodiment of the present disclosure.

More specifically, referring to FIG. 3, the step S120 includes disposing the base film 1 on a tray S of a vacuum deposition apparatus 100 and respectively disposing two different inorganic materials (e.g., aluminum oxide and silicon oxide) on two tungsten carriers (e.g., a first tungsten carrier C1 and a second tungsten carrier C2) of the vacuum deposition apparatus 100, evacuating a deposition chamber ER of the vacuum deposition apparatus 100 with a vacuum pump V so that a vacuum environment is created, and respectively heating the two different inorganic materials with a first heating source H1 and a second heating source H2 of the vacuum deposition apparatus 100 by using a rotation switching mechanism R to rotate and switch the first heating source H1 and the second heating source H2, so that the at least one first inorganic material deposition layer 21 (e.g., aluminum oxide deposition layer) and the second inorganic material deposition layer 22 (e.g., silicon oxide deposition layer) are sequentially deposited on the surface of the base film 1 in the same vacuum deposition process and in the vacuum condition.

In addition, the first heating source H1 is a thermal resistance heating source, and the second heating source G2 is an electron beam heating source.

It should be noted that, through the dual heating source design with the first heating source H1 and the second heating source H2, the vacuum deposition apparatus 100 of the embodiment of the present disclosure can achieve the technical purpose of "the two different inorganic material deposition layer being able to be deposited on the surface of the base film 1 in the same vacuum deposition process and in the vacuum condition".

It should be noted that the first heating source H1 (the thermal resistance heating source) heats the inorganic materials in a thermally conductive manner. Furthermore, a heating manner of the second heating source H2 (the electron beam heating source) is that the kinetic energy of the electron beam is converted into heat energy for melting inorganic materials. The heating manner of the second heating source H2 has a high heat conversion efficiency and a precisely controlled deposition rate.

In some embodiments of the present disclosure, since aluminum oxide (AlOx) inorganic material has a lower deposition temperature, aluminum oxide (AlOx) inorganic material is disposed on the first tungsten carrier C1 that is arranged above and adjacent to the first heating source H1. Furthermore, since silicon oxide (SiOx) inorganic material has a greater deposition temperature, silicon oxide (SiOx) inorganic material is disposed on the second tungsten carrier C2 that is arranged above and adjacent to the second heating source H2.

In addition, the first heating source H1 and the second heating source H2 are all disposed in the deposition chamber ER of the vacuum deposition apparatus 100. According to deposition requirements, the rotation switching mechanism R is operated to rotate and switch the first heating source H1 and the second heating source H2, such that more than two of the inorganic material deposition layers can be deposited without breaking the vacuum.

A switching manner of the rotation switching mechanism R sequentially includes arranging the first heating source H1 above the second heating source H2, and arranging the first heating source H1 to the rear after the aluminum oxide (AlOx) inorganic material is deposited, so that the second heating source H2 can deposit to the silicon oxide (SiOx) inorganic material. Furthermore, the first heating source H1 or the second heating source H2 will be blocked by a shutter P during the heating process, and the shutter P will not be removed until the temperature reaches the set value.

It should be noted that if the vacuum evaporation apparatus 100 only uses a single heating source (e.g., the thermal resistance heating source), the cost of the inorganic materials may be excessive, and a purity of the deposition layer is insufficient. Furthermore, the single heating source (e.g., the thermal resistance heating source) generally can generally only deposit a single inorganic material deposition layer in the same vacuum deposition process. If multiple different inorganic material deposition layers need to be deposited, the vacuum of the vacuum deposition apparatus 100 needs to first be broken, then the inorganic materials are replaced, and then the vacuum deposition apparatus 100 is again vacuumized so that the subsequent operation can be carried out.

The step S120 further includes breaking the vacuum of the vacuum deposition apparatus 100 after forming the inorganic laminated film 2, and then taking out the base film 1 formed with the inorganic laminated film 2 from the vacuum deposition apparatus 100.

According to the above-mentioned technical means, the method of the embodiment of the present disclosure can deposit the two or more inorganic material deposition layers on the base film 1, so that a problem of the deposition layer being easily broken that is resulted from plating too thick of a single inorganic material deposition layer can be avoided.

Furthermore, the two or more inorganic material deposition layers can have a high transparency, a low haze, excellent water and oxygen barrier properties, and low cost. In addition, the two inorganic material deposition layers adjacent to each other are respectively formed by different inorganic metal oxides so that functions of blocking moisture and oxygen thereof can be improved.

As shown in FIG. 1 and FIG. 2C, the step S130 includes coating a barrier coating solution on the inorganic laminated film 2 and then curing the barrier coating solution to form a barrier coating layer 3.

More specifically, the step S130 includes coating the barrier coating solution on a side surface of the inorganic laminated film 2, and the side surface of the inorganic laminated film 2 is distal to the base film 1. In addition, the step S130 includes curing the barrier coating solution (e.g., remove liquid components thereof) to form the barrier coating layer 3.

It should be noted that the barrier coating layer 3 is a single-layer coating layer and has functions of blocking moisture and oxygen, and the barrier coating layer 3 is used to protect the inorganic laminated film 2.

In the present embodiment, the barrier coating layer 3 has a thickness that is within a range from 0.5 nm to 2 nm. In addition, the barrier coating solution used to form the barrier coating layer 3 contains a resin material, a crosslinking agent, filler particles treated with a surface modification treatment agent, an additive, and a water solvent.

Based on a total weight of the barrier coating solution being 100 wt %, a content of the resin material is within a range from 2 wt % to 20 wt %, a content of the crosslinking agent is within a range from 1 wt % to 10 wt %, a content of the filler particles treated with the surface modification treatment agent is within a range from 0.05 wt % to 40 wt %, a content of the additive is within a range from 0.05 wt % to 10 wt %, and a content of the water solvent is within a range from 25 wt % to 85 wt %.

The resin material is at least one material selected from a group consisting of polyetheramine (PEA), ethylene-ethyl acrylate (EEA), ethylene-vinyl alcohol copolymer (EVOH), and polyvinyl alcohol (PVA), and have functions of water and oxygen barrier.

The crosslinking agent is at least one material selected from a group consisting of maleic acid (MA, also known as cis-butenedioic acid), tartaric acid (TAC), tri-mesoly chloride (TMC), succinic acid, suberic acid, malic acid (2-hydroxysuccinic acid), glyoxal, glutaraldehyde, and toluene dialdehyde.

The surface modification treatment agent is at least one material selected from a group consisting of vinyl silane coupling agent, epoxy silane coupling agent, styryl silane coupling agent, methacryloyloxysilane coupling agent, acryloyloxysilane coupling agent, aminosilane coupling agent, isocyanurate silane coupling agent, ureasilane coupling agent, and isocyanate silane coupling agent.

The filler particles are at least one material selected from a group consisting of graphene, carbon nanotube, clay, talcum powder, mica powder, kaolinite, montmorillonite, silicon oxide (silica), aluminum oxide (alumina), and calcium carbonate.

The additive is at least one material selected from a group consisting of a leveling agent, a wetting agent, a de-foamer, a UV absorber, a preservative, and an antistatic agent.

The main component of the water solvent is pure water, and other components such as methanol, ethanol, isopropanol, and/or ethylene glycol can be selectively added.

The base film 1 formed in the above-mentioned step S110, the inorganic laminated film 2 formed in the above-mentioned step S120, and the barrier coating layer 3 formed in the above-mentioned step S130 can together constitute the food packaging barrier film.

The food packaging barrier film has the inorganic laminated film 2 that includes the two different inorganic material deposition layers 21, 22 and is formed in the same vacuum deposition process. The food packaging barrier film can have excellent water and oxygen barrier properties. It should be noted that, by depositing the two different inorganic material deposition layers 21, 22 on the base film 1, the two different inorganic material deposition layers 21, 22 can complement each other in terms of material properties.

Therefore, compared with the food packaging barrier film having the base film 1 on which two identical inorganic material deposition layers are deposited, the food packaging barrier film having the base film 1 on which the two different inorganic material deposition layers 21, 22 are deposited can have greater water and oxygen barrier properties.

For instance, the food packaging barrier film having the base film 1 on which the aluminum oxide (AlOx) inorganic material deposition layer and the silicon oxide (SiOx) deposition layer are deposited has higher water and oxygen barrier properties than the food packaging barrier film having the base film 1 on which the two aluminum oxide (AlOx) inorganic material deposition layers are deposited, or than the food packaging barrier film having the base film 1 on which the two silicon oxide (SiOx) deposition layers are deposited.

The food packaging barrier film has an oxygen transmission rate (OTR) that is no more than 1 cc/m$^2$·day·atm and a water vapor transmission rate (WVTR) that is no more than 1 g/m$^2$·day·atm. Furthermore, the food packaging barrier film has a visible light transmittance that is not less than 90% and a haze value that is no more than 3%.

The food packaging barrier film has the single barrier coating layer 3 formed on the inorganic material deposition layer, and the single barrier coating layer 3 can be used to protect the inorganic material deposition layers 21, 22. In addition, the barrier coating layer 3 also has certain water and oxygen barrier properties.

The method for producing the food packaging barrier film provided by the present embodiment of the disclosure has a lower material cost and a lower coating engineering cost. The food packaging barrier film provided by the present embodiment of the disclosure has properties such as a high transparency, a low haze, and excellent water and oxygen barrier properties, so that the application of the food packaging barrier film can be increased. For instance, consumers will be able to clearly see the content of the packaged goods through the food packaging barrier film.

[Food Packaging Barrier Film]

The method for producing the food packaging barrier film of the embodiment of the present disclosure is described above, and the food packaging barrier film of the embodiment of the present disclosure is described below.

As shown in FIG. 2C, the food packaging barrier film includes a base film 1, an inorganic laminated film 2, and a barrier coating layer 3. The inorganic laminated film 2 is form on a surface of the base film 1, and the inorganic laminated film 2 includes at least one first inorganic material deposition layer 21 and a second inorganic material deposition layer 22 stacked upon each other. In addition, the at least one first inorganic material deposition layer 21 and the second inorganic material deposition layer 22 are formed in the same vacuum deposition process and in a vacuum condition, and the at least one first inorganic material deposition layer 21 and the second inorganic material deposition layer 22 are respectively formed by different inorganic metal oxides in the same vacuum deposition process. Furthermore, the barrier coating layer 3 is formed on the inorganic laminated film 2, and the barrier coating layer 3 is formed by coating a barrier coating solution on the inorganic laminated film 2 and then curing the barrier coating solution.

The food packaging barrier film has an oxygen transmission rate that is no more than 1 cc/m$^2$·day·atm, a water vapor transmission rate that is no more than 1 g/m$^2$·day·atm, a visible light transmittance that is not less than 90%, and a haze value that is no more than 3%.

It should be noted that, the food packaging barrier film is suitable for attaching on a non-stretched polypropylene film (CPP film) to form a food packaging material.

More specifically, the base film 1 of the food packaging barrier film (e.g., PET film) faces the external environment, and the barrier coating layer 3 of the food packaging barrier film is used to attach onto the non-stretched polypropylene film and face an inside of the packaging material, but the present disclosure is not limited thereto.

More specifically, the base film 1 is a polyester film and has a thickness that is within a range from 5 μm to 300 μm, the at least one first inorganic material deposition layer 21 has a thickness that is within a range from 1 nm to 100 nm, the second inorganic material deposition layer 22 has a thickness that is within a range from 1 nm to 100 nm, and the barrier coating layer 3 has a thickness that is within a range from 0.5 μm to 2 μm.

In some embodiments of the present disclosure, the inorganic metal oxides is transparent and is at least one material selected from a group consisting of aluminum oxide (AlOx), silicon oxide (SiOx), cobalt oxide (CoOx), silicon nitride (SiNx), silicon nitride (ZrO2), indium tin oxide (ITO), and tantalum pentoxide (Ta2O5).

Preferably, the inorganic metal oxides is at least one material selected from a group consisting of aluminum oxide (AlOx) and silicon oxide (SiOx). In addition, the at least one first inorganic material deposition layer 21 is the aluminum oxide (AlOx) deposition layer, and the second inorganic material deposition layer 22 is the silicon oxide (SiOx) deposition layer.

In some embodiments of the present disclosure, the barrier coating solution contains a resin material, a crosslinking agent, filler particles treated with a surface modification treatment agent, an additive, and a water solvent. In addition, based on a total weight of the barrier coating solution being 100 wt %, a content of the resin material is within a range from 2 wt % to 20 wt %, a content of the crosslinking agent is within a range from 1 wt % to 10 wt %, a content of the filler particles treated with the surface modification treatment agent is within a range from 0.05 wt % to 40 wt %, a content of the additive is within a range from 0.05 wt % to 10 wt %, and a content of the water solvent is within a range from 25 wt % to 85 wt %.

Experimental Data Testing

Referring to examples 1-5 and comparative examples 1-4 below, the content of the present disclosure is described in detail. However, the following embodiments are only provided for the purpose of facilitating a better understanding of the present disclosure, and the scope of the present disclosure is not limited to these embodiments.

Example 1: The food packaging barrier film is produced by the method for producing the same of the above-mentioned embodiment of the present disclosure. In addition, the base film is a PET film, and a thickness of the base film as shown in Table 1 below. The inorganic laminated film includes the first inorganic material deposition layer and the second inorganic material deposition layer, the first inorganic material deposition layer is the aluminum oxide (AlOx) deposition layer, and the second inorganic material deposition layer is the silicon oxide (SiOx) deposition layer. In addition, the thickness of the aluminum oxide (AlOx) deposition layer and the silicon oxide (SiOx) deposition layer are as shown in Table 1 below.

The barrier coating solution that is used to form the barrier coating layer contains the water solvent, the filler particles (talcum powder and mica powder), the resin material (EVOH and PVA), the crosslinking agent (maleic acid and glutaraldehyde), and the additive (wetting agent, de-foamer, UV absorber, and preservative).

The content range (wt %) of each component in the barrier coating solution is shown in Table 1 below, and the physical property test results of the barrier film of the example 1 are shown in Table 1 below. The barrier film has the visible light transmittance that is 92%, the haze value that is 2.2%, the water vapor transmission rate that is 0.087 g/m$^2$·day·atm, the oxygen transmission rate that is 0.075 cc/m$^2$·day·atm.

The materials used in the examples 2-5 are the same as the above-mentioned example 1, the differences between the examples 2-5 and the example 1 are the thickness of the aluminum oxide deposition layer, the thickness of the silicon oxide deposition layer, and the formulation of the barrier coating solution.

The food packaging barrier film of the examples 1-5 all have the oxygen transmission rate that is no more than 1 cc/m$^2$·day·atm, the water vapor transmission rate that is no more than 1 g/m$^2$·day·atm, the visible light transmittance that is not less than 90%, and the haze value that is no more than 3%.

The difference between the comparative examples 1-4 and the above-mentioned examples 1-5 is that the laminated structures of the first and second inorganic material deposition layers 21, 22 of the comparative examples 1-4 are not provided at the same time, or that the barrier coating layer 3 is not provided. The oxygen transmission rate and water vapor transmission rate of the comparative examples 1-4 are all significantly higher than the examples 1-5. Accordingly, the comparative examples 1-4 do not have ideal water and oxygen barrier effects.

TABLE 1

| Items | | Example 1 | Example 2 | Example 3 | Example 4 | Example 5 | Comparative example 1 | Comparative example 2 | Comparative example 3 | Comparative example 4 |
|---|---|---|---|---|---|---|---|---|---|---|
| Inorganic laminated film | Thickness of Aluminum oxide | 10 nm | 10 nm | 10 nm | 20 nm | 30 nm | 20 nm | 40 nm | 40 nm | — |
| | Thickness of Silicon oxide | 10 nm | 10 nm | 30 nm | 20 nm | 10 nm | — | — | — | — |
| Water | water solvent | 78.0 | 78.0 | 78.0 | 78.0 | 78.0 | 78.0 | 78.0 | — | 78.0 |
| Particle | talcum powder | 1.0 | 1.0 | 1.0 | 1.0 | 1.0 | 1.0 | 1.0 | — | 1.0 |
| | mica powder | 2.0 | 2.0 | 2.0 | 2.0 | 2.0 | 2.0 | 2.0 | — | 2.0 |
| Resin | EVOH | 10.0 | — | — | — | — | — | — | — | — |
| | PVA | — | 10.0 | 10.0 | 10.0 | 10.0 | 10.0 | 10.0 | — | 10.0 |
| Crosslinking agent | maleic acid | 2.5 | 2.5 | 2.5 | 2.5 | 2.5 | 2.5 | 2.5 | — | 2.5 |
| | glutaraldehyde | 2.5 | 2.5 | 2.5 | 2.5 | 2.5 | 2.5 | 2.5 | — | 2.5 |
| Additive | wetting agent | 0.5 | 0.5 | 0.5 | 0.5 | 0.5 | 0.5 | 0.5 | — | 0.5 |
| | de-foamer | 0.5 | 0.5 | 0.5 | 0.5 | 0.5 | 0.5 | 0.5 | — | 0.5 |
| | UV absorber | 0.5 | 0.5 | 0.5 | 0.5 | 0.5 | 0.5 | 0.5 | — | 0.5 |
| | preservative | 2.5 | 2.5 | 2.5 | 2.5 | 2.5 | 2.5 | 2.5 | — | 2.5 |
| Comparison of physical properties | PET film thickness | 12 μm | 12 μm | 12 μm | 12 μm | 12 μm | 12 μm | 12 μm | 12 μm | 12 μm |
| | Coated surface | Single layer | Single layer | Single layer | Single layer | Single layer | Single layer | Single layer | — | Single layer |
| | light permeable rate | 92.0% | 92.3% | 92.8% | 92.4% | 92.6% | 92.3% | 92.5% | 89.7% | 91.6% |
| | haze | 2.2% | 2.4% | 2.4% | 2.6% | 2.7% | 2.5% | 2.7% | 3.1% | 2.3% |
| | WVTR | 0.087 | 0.077 | 0.062 | 0.054 | 0.068 | 0.785 | 0.435 | 2.505 | 20.832 |
| | OTR | 0.075 | 0.060 | 0.036 | 0.028 | 0.058 | 0.628 | 0.230 | 2.635 | 9.856 |

Beneficial Effects of the Embodiments

In conclusion, the method for producing the food packaging barrier film provided by the present embodiment of the disclosure has a lower material cost and a lower coating engineering cost. The food packaging barrier film provided by the present embodiment of the disclosure has a high transparency, a low haze, and excellent water and oxygen barrier properties, so that the application of the food packaging barrier film can be increased. For instance, buyers can see the contents packaged through the food packaging barrier film.

More specifically, since the at least one first inorganic material deposition layer 21 and the second inorganic material deposition layer 22 of the inorganic laminated film are formed in the same vacuum deposition process and in the vacuum condition, a bonding interface between the at least one first inorganic material deposition layer 21 and the second inorganic material deposition layer 22 can be denser and have a stronger bonding force, so that the water and oxygen barrier properties of the inorganic laminated film can be improved.

Conversely, if the vacuum is broken after the step of forming the at least one first inorganic material deposition layer 21, the surface of the at least one first inorganic material deposition layer 21 may be qualitatively changed due to contact with air, so that the at least one first inorganic material deposition layer 21 may undergo qualitative change. Accordingly, the bonding force between the at least one first inorganic material deposition layer 21 and the second inorganic material deposition layer 22 becomes poor, thereby reducing the water and oxygen barrier effects of the inorganic laminated film.

More specifically, since the at least one first inorganic material deposition layer 21 and the second inorganic material deposition layer 22 are formed in the same vacuum deposition process and in the vacuum condition, the manufacturing cost of the barrier film can be effectively reduced.

More specifically, the inorganic laminated film includes at least two different inorganic material deposition layers, and the two different inorganic material deposition layers are complementary in material properties, so that the inorganic laminated film can have better water and oxygen barrier effects.

More specifically, the at least one first inorganic material deposition layer 21 is aluminum oxide (AlOx) deposition layer, and the second inorganic material deposition layer 22 is silicon oxide (SiOx) deposition layer. In addition, the material hardness of the at least one first inorganic material deposition layer 21 is greater than the material hardness of the second inorganic material deposition layer 22. That is, the second inorganic material deposition layer 22 is softer than the at least one first inorganic material deposition layer 21. Accordingly, when the food packaging barrier film is bent, the second inorganic material deposition layer 22 is configured to buffer a stress that is provided by the at least one first inorganic material deposition layer 21, thereby avoiding the occurrence of rupture.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A food packaging barrier film, comprising:
- a base film;
- an inorganic laminated film formed on a surface of the base film, wherein the inorganic laminated film includes a first inorganic material deposition layer, a second inorganic material deposition layer, and a third inorganic material deposition layer sequentially stacked on one another, and the first inorganic material deposition layer and the second inorganic material deposition layer are formed in a same vacuum deposition process and in a vacuum condition, and wherein the first inorganic material deposition layer and the second inorganic material deposition layer are respectively formed by different inorganic metal oxides in the same vacuum deposition process, wherein the first inorganic material deposition layer is an aluminum oxide deposition layer, the second inorganic material deposition layer is a silicon oxide deposition layer, and the third inorganic material deposition layer is an aluminum oxide deposition layer; and
- a barrier coating layer formed on the inorganic laminated film, wherein the barrier coating layer is formed by coating a barrier coating solution on the inorganic laminated film and then curing the barrier coating solution.

2. The food packaging barrier film according to claim 1, wherein a material hardness of the first inorganic material deposition layer is greater than a material hardness of the second inorganic material deposition layer, and wherein, when the food packaging barrier film is bent, the second inorganic material deposition layer is configured to buffer a stress that is provided by the first inorganic material deposition layer.

3. The food packaging barrier film according to claim 1, wherein the food packaging barrier film has an oxygen transmission rate that is no more than 1 $cc/m^2 \cdot day \cdot atm$, a water vapor transmission rate that is no more than 1 $g/m^2 \cdot day \cdot atm$, a visible light transmittance that is not less than 90%, and a haze value that is no more than 3%.

4. The food packaging barrier film according to claim 1, wherein the base film is a polyester film and has a thickness that is within a range from 5 μm to 300 μm, wherein the first inorganic material deposition layer has a thickness that is within a range from 1 nm to 100 nm, and the second inorganic material deposition layer has a thickness that is within a range from 1 nm to 100 nm.

5. The food packaging barrier film according to claim 1, wherein the barrier coating solution contains a resin material, a crosslinking agent, filler particles treated with surface modification treatment agent, an additive, and a water solvent, and wherein based on a total weight of the barrier coating solution being 100 wt %, a content of the resin material is within a range from 2 wt % to 20 wt %, a content of the crosslinking agent is within a range from 1 wt % to 10 wt %, a content of the filler particles treated with the surface modification treatment agent is within a range from 0.05 wt % to 40 wt %, a content of the additive is within a range from 0.05 wt % to 10 wt %, and a content of the water solvent is within a range from 25 wt % to 85 wt %.

6. A food packaging barrier film, comprising:
- a base film;

an inorganic laminated film formed on a surface of the base film, wherein the inorganic laminated film includes a first inorganic material deposition layer, a second inorganic material deposition layer, and a third inorganic material deposition layer sequentially stacked on one another, and the first inorganic material deposition layer and the second inorganic material deposition layer are respectively formed by different inorganic metal oxides, and wherein a material hardness of the first inorganic material deposition layer is greater than a material hardness of the second inorganic material deposition layer, wherein the first inorganic material deposition layer is an aluminum oxide deposition layer, the second inorganic material deposition layer is a silicon oxide deposition layer, and the third inorganic material deposition layer is an aluminum oxide deposition layer; and a barrier coating layer formed on the inorganic laminated film, wherein the barrier coating layer is formed by coating a barrier coating solution on the inorganic laminated film and then curing the barrier coating solution;

wherein, when the food packaging barrier film is bent, the second inorganic material deposition layer is configured to buffer a stress that is provided by the first inorganic material deposition layer.

* * * * *